April 28, 1964 CHANG SOO KIM 3,131,353

SELF-OSCILLATING TUNNEL DIODE FREQUENCY CONVERTERS

Filed June 19, 1961 3 Sheets-Sheet 1

INVENTOR:
CHANG SOO KIM,

BY Dudley T. Ready
HIS AGENT.

April 28, 1964 CHANG SOO KIM 3,131,353

SELF-OSCILLATING TUNNEL DIODE FREQUENCY CONVERTERS

Filed June 19, 1961 3 Sheets-Sheet 2

INVENTOR:
CHANG SOO KIM ,

BY Dudley T. Ready
HIS AGENT.

INVENTOR:
CHANG SOO KIM,
BY Dudley T. Ready
HIS AGENT.

United States Patent Office 3,131,353

Patented Apr. 28, 1964

3,131,353

SELF-OSCILLATING TUNNEL DIODE FREQUENCY CONVERTERS

Chang Soo Kim, East Syracuse, N.Y., assignor to General Electric Company, a corporation of New York Filed June 19, 1961, Ser. No. 118,088

8 Claims. (Cl. 325—449)

The present invention relates to improved frequency converter circuits suitable for general communications-type applications but particularly adapted for microwave frequencies. The circuits utilize a tunnel diode to perform three simultaneous functions: mixing, oscillation and amplification.

The tunnel diode is a recently developed semiconductor negative resistance device characterized by a narrow transition junction between n-type and p-type semiconductor regions on the order of one hundred angstroms in thickness, which regions are doped to a carrier concentration on the order of $10^{19}$ per cubic centimeter so as to give rise to a degenerate, tunneling action. A graphical representation of the device current-voltage characteristic in the useful first quadrant is the N shaped curve (a short circuit stable device). The middle portion of the curve has a negative slope which provides an operating region in which gain is available to produce oscillation or amplification in accordance with the circuit conditions. Since the conductance in this region of the current-voltage characteristic is nonlinear, it is also possible to obtain mixing. These tunnel diode properties suggest the possibility of frequency converters which are compact, have a small component count and only require a low power D.-C. voltage source as opposed to the relatively cumbersome power supplies required by parametric amplifiers and the independent local oscillators required by conventional mixer circuits. These properties of the tunnel diode are well known and a fuller disclosure thereof is available in the article in Electrical Engineering, April 1960 ("Tunnel Diode Operation and Application" by I. A. Lesk and J. J. Suran).

The operation of a self-oscillating frequency converter is dependent upon the existence of the proper admittance characteristics of the circuit over the spectrum of real frequencies from zero to infinity. It is necessary that the circuit be adjusted to provide an oscillating or amplification condition at the three frequencies: input or RF signal frequency $\omega_{rf}$, the local oscillator frequency $\omega_{lo}$, and the output or intermediate-frequency $\omega_{if}$. The first requirement for either of these conditions is that the imaginary component of the admittance must be zero or at least small at the specified frequencies, that is, resonance is required. To obtain oscillation at the local oscillator frequency $\omega_{lo}$, a second requirement is that the real component of the total circuit admittance for small signals must be zero or negative. Stated in another way for circuits employing a two-terminal active device as considered herein, the passive admittance presented to the negative conductance of the active device must be equal to or less than the magnitude of the negative conductance. To obtain amplification at $\omega_{rf}$ and $\omega_{if}$, the second requirement is that the magnitude of the admittance presented to the negative conductance of the active device must be greater than the magnitude of the negative conductance. For operating stability, it is desired that the converter circuit neither oscillate nor amplify at frequencies other than those specified and the admittance characteristics must be accordingly adjusted.

Realization of a microwave tunnel diode converter involves substantial difficulties. Because the tunnel diode is a two-terminal device, the diode does not provide isolation between the input and output circuits. Accordingly, there is generally substantial interaction between the various portions of the circuit such as the intermediate-frequency tank circuit and the local oscillator. Variations in the admittance of one portion of the circuit to meet one of the converter requirements at a particular frequency will change the overall frequency responsive characteristics of the circuit. The tunnel diode presents further problems at microwave frequency because the parasitic impedances inherent in the device arising from the device package and the tunnel diode junction become significant. For these reasons, a practical microwave tunnel diode converter must enable proper adjustment of the circuit admittances over the frequency spectrum and must provide impedance characteristics which produce resonance with the tunnel diode parasitic impedances.

Accordingly, it is an object of the invention to provide a self-oscillating microwave frequency converter utilizing a two-terminal active device in which the adjustment of the frequency responsive characteristics at the input radio-frequency, local oscillator frequency and output intermediate-frequency can be adjusted substantially independently.

It is a further object of the invention to provide a self-oscillating microwave tunnel diode frequency converter in which a local oscillator resonator is formed in conjunction with the parasitic impedances of the tunnel diode device.

It is also an object of the invention to provide a self-oscillating frequency converter circuit suitable for microwave applications with mixing performed at a harmonic of the local oscillator frequency.

Briefly stated ,in accordance with one aspect of the invention, a self-oscillating frequency converter is provided utilizing microwave components. A section of transmission line provides a resonator at the desired local oscillator frequency by positioning a capacitive element across the transmission line section at a point which is a quarter wavelength of the local oscillator wave distant from one end so that the capacitive element provides a node at the local oscillator frequency. A tunnel diode is connected across the transmission line section at the second end of the section and is positioned a distance from the capacitive element such that an inductance is provided which with the parasitic impedance of the tunnel diode device produces resonance at the local oscillator frequency. A source of D.-C. bias is connected to the transmission line section at the node point provided by the capacitive element to bias the tunnel diode into the region of negative conductance. Also connected to the transmission line section across the capacitive element node is an intermediate frequency circuit branch which produces an amplified output signal.

The features of the invention which are believed to be novel are set forth with particularity in the appended claims. The invention itself, however, both as to its organization and method of operation, together with further objects and advantages thereof, may best be understood by reference to the following description when taken in connection with the drawings wherein:

Figure 1A:
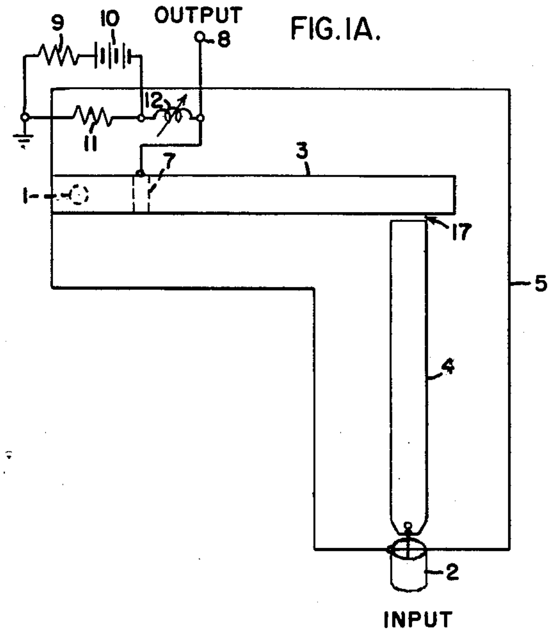
FIGURE 1A is an illustrative embodiment of a self-oscillating microwave tunnel diode converter utilizing a strip line as a microwave transmission line.

FIGURE 1A is a plan view of a tunnel diode frequency converter in a microwave strip line configuration. A radio-frequency input signal is introduced from coaxial cable 2 to the mixer strip 3 through a coupling strip 4. The strips 3 and 4 are conductors positioned a fixed distance from a conductive ground plane 5 and accordingly serve as transmission lines in a known manner. The end of strip 4 is spaced from strip 3 as at 17 to provide capacitive coupling. A tunnel diode 1 is connected between the ground plane 5 and the mixer strip 3 at one end thereof and the other end of the strip is open. Intermediate the ends of the mixer strip is placed a capacitor 7, conveniently a strip of dielectric such as barium titanate, which is a quarter wavelength of the local oscillator frequency wave distant from the open end of the mixer strip 3. The length of the strip is selected such that in addition to this quarter wavelength resonator relationship, the reactance of the strip between capacitor 7 and the tunnel diode 1 produces resonance with the parasitic reactance of the tunnel diode device (as will be explained below). An output intermediate-frequency signal is produced by the mixing of local oscillator and the input signal and is derived from the mixer strip at the microwave shorting capacitor 7 which is a node for the radio-frequency and local oscillator waves by a connection to the output terminal 8. A variable inductor 12 connected in parallel with capacitor 7 provides an if tank circuit. An adjustable D.-C. voltage divider network is provided by variable bias resistor 9, bias source 10 and a bias resistor 11.

Figure 1B:
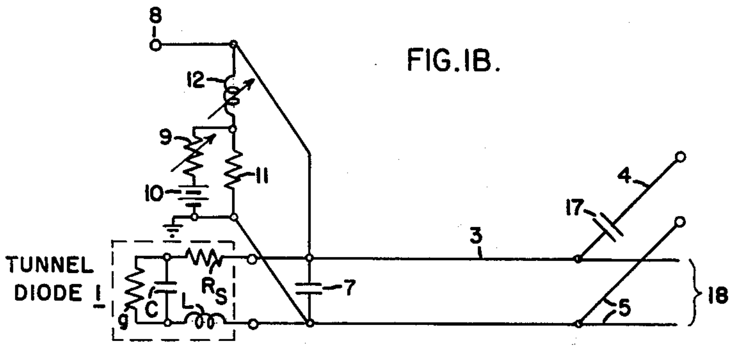
FIGURE 1B is a schematic diagram of the equivalent circuit of FIGURE 1A

FIGURE 1B is a schematic diagram of the FIGURE 1A mixer circuit. In addition to the circuit components illustrated in FIGURE 1A, with the same reference characters, the parasitic impedances of the tunnel diode 1 is illustrated. The parasitic impedances of a tunnel diode device, produced by the device package and tunnel diode junction, include a capacitance C in parallel with the negative conductance $g$, series resistance $R_s$ and series inductance L. These parasitic impedances are generally negligible at low frequencies, but at microwave frequencies it is necessary to provide minimum inductance packaging, etc. Since the parasitic impedances can not be eliminated, it is also necessary to include the parasitic effects in providing the proper frequency response characteristics of the circuit. The simplest method of compensating for the parasitic impedance is by the proper selection of the transmission line length. By making the distance between the capacitance 7 and the tunnel diode 1 positioned at one end proper, this portion of the transmission lines present an impedance to the tunnel diode such as to present a zero susceptance to the tunnel diode negative conductance. This enables operation either above or below the self-resonant frequency of the tunnel diode device, but less than the cutoff frequency. The capacitance 17 provided by the gap between mixer strip 3 and coupling strip 4 produces coupling between the input circuit and the converter. The position of the coupling strip 4 between the capacitance 7 and the open end 18 of the mixer strip 3 is determined empirically in accordance with the maximum transfer of RF power without changing the local oscillator characteristics.

Figure 1C:
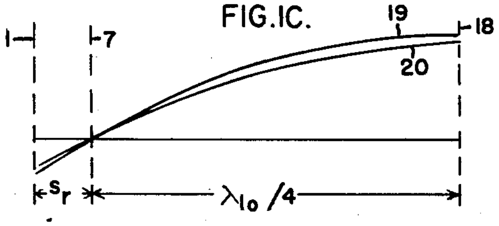
FIGURE 1C is an illustration of the standing wave pattern for the local oscillator wave in the circuit of FIGURE 1A and 1B.

FIGURE 1C illustrates standing waves 19 and 20 for the FIGURE 1A circuit for waves at the local oscillator and input frequencies, respectively. The dash line 7 corresponds to the position of the capacitor 7 which is substantially a short at microwave frequencies and is a node for the local oscillator wave. The open end of the waveguide 18 is a quarter wavelength of the local oscillator wave, $\lambda_{lo}/4$, distant from the node and thereby provides essentially a resonator for the local oscillator wave. This distance is slightly less than a quarter wavelength of the input wave 20 (or greater if $\omega_{rf}$ is greater than $\omega_{lo}$). The input signal frequency is close to the local oscillator (or an integral multiple thereof) so that the mixer strip 3 is near resonant therefor and shorting capacitor is effectively a node. The tunnel diode 1 is positioned less than a quarter wavelength distance from the capacitor 7 at a point such that this portion of the transmission line $s_r$ produces a reactance which is selected so that the imaginary part of the admittance presented to the tunnel diode negative conductance is zero at the local oscillator frequency.

As shown in FIGURES 1A, 1B and 1C, the capacitor 7 is at a node position of the local oscillator wave and the bias and intermediate-frequency branch circuits connected thereto are accordingly isolated from the local oscillator wave. The standing wave pattern of the input radio-frequency wave is similar to the local oscillator wave, also having a node at the microwave short provided by the capacitor 7 but not being an exact quarter wavelength from the open end of the waveguide. The D.-C. bias source 10 and bias resistors 9 and 11 need only supply sufficient power to produce the proper D.-C. bias for tunnel diode 1. Since the bias circuit branch connection is at a node for the input radio-frequency and local oscillator waves, the impedances of this branch have no effect on the frequency responsive characteristics of the converter and can therefore be independently selected and adjusted. The intermediate-frequency circuit branch being also connected to the node (for $\omega_{lo}$ and $\omega_{rf}$) at capacitor 7 on the mixer strip 3 is also independent of the microwave frequency responsive characteristics.

Although the microwave converter of FIGURE 1A utilizes a strip line, it is to be understood that any microwave transmission line such as coaxial cable or waveguide can be employed. The converter embodiment illustrated provides some simplification of structure in that some common connections are made for the bias circuit branch and the intermediate-frequency circuit branch. Further simplifications are provided by utilizing the capacitor 7 as part of an intermediate-frequency parallel tank circuit with variable inductor 12 providing a tuning element. If isolation is desired between the bias circuit branch and the intermediate-frequency circuit branch, the bias voltage divider can be shunted by a bypass capacitor.

Figures 4A, 4B:
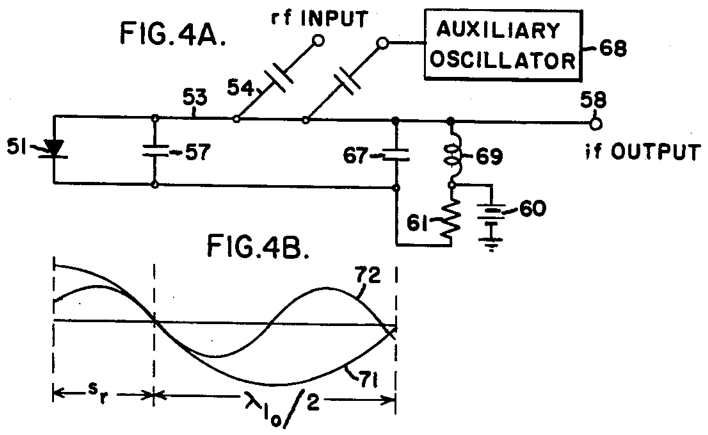
FIGURE 4A is an equivalent circuit in schematic form of a tunnel diode frequency converter in a microwave harmonic configuration and FIGURE 4B is an illustration of standing wave patterns for the radio-frequency and local oscillator waves in the circuit of FIGURE 4A.

The operation of the FIGURE 1A circuit is more easily understood in reference to FIGURES 2 and 4A.

Figure 2A:
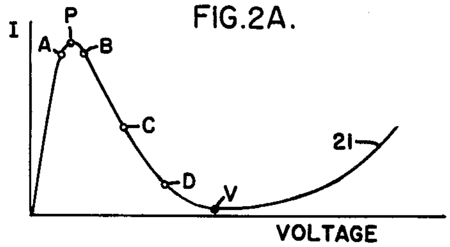
FIGURE 2A is a graph of the current-voltage characteristic of the tunnel diode 1 in FIGURE 1A.

FIGURE 2A is a graph of current 21 in tunnel diode 1 of FIGURE 1A as a function of voltage. The tunnel diode characteristic is roughly in the shape of an N for the first quadrant of current and voltage. For small forward bias, there is a large forward current indicated at A followed by a maximum or peak current at P. For a slightly larger bias, the current is reduced as at B. Further increases in voltage result in further reductions in current at points C and D, and finally, a minimum or valley current results which is indicated at V.

Figure 2B:
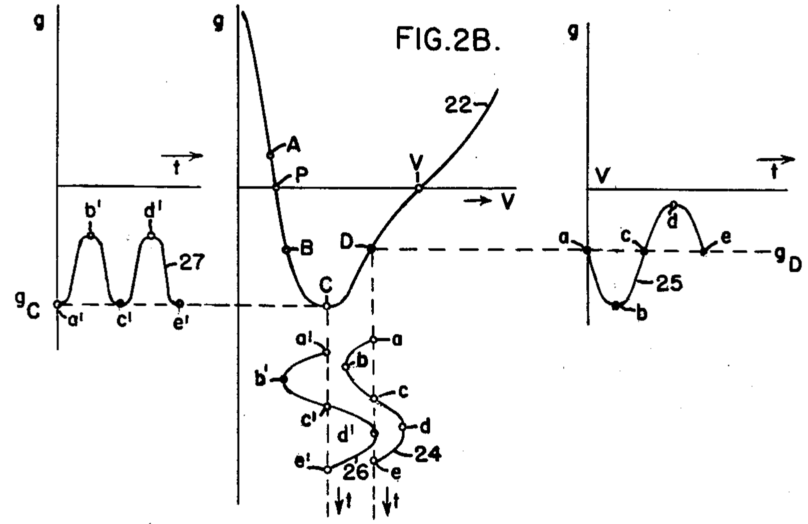
FIGURE 2B is a graph of conductance $g$ as a function of voltage for the tunnel diode 1 and illustrates representative waveforms.

FIGURE 2B is a graph of dynamic conductance 22 as a function of the applied voltage for the tunnel diode of FIGURE 2A and representative waveforms. The curve 22 is a plot of the slope of curve 21 with points A, P, B, C, D and V derived from the corresponding point on curve 21. In the circuit of FIGURE 1A, the D.-C. bias source determines an operating point such as C or D. For a small amplitude input radio-frequency wave, the voltage appearing across the tunnel diode is substantially determined by the local oscillator wave superimposed on the D.-C. bias. With a D.-C. bias at D, a sinusoidal local oscillator wave 24 produces a substantially sinusoidal variation in the conductance 25 of the tunnel diode at the local oscillator frequency. This conductance variation produces a frequency conversion of the radio-frequency wave to an intermediate-frequency signal. However, if the D.-C. bias is at a point such that the voltage swing of the local oscillator wave 26 produces a decrease in the tunnel diode conductance for both positive and negative swings, the variation in the conductance 27 approximates a sinusoidal variation in the conductance at twice the frequency of the local oscillator waves. This relation is significant for harmonic operation as described hereinafter.

Figure 3:
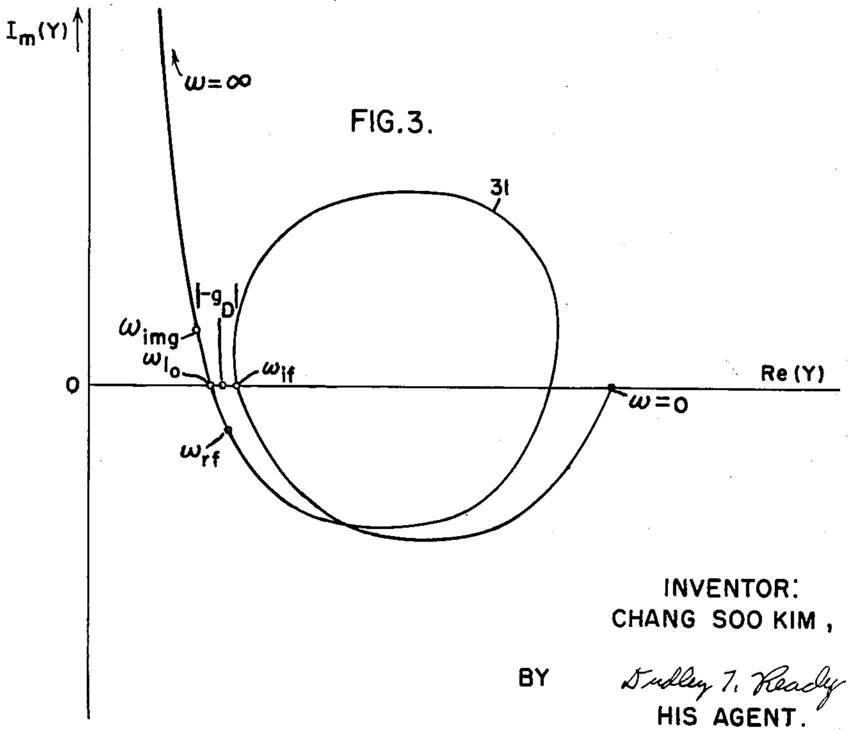
FIGURE 3 is an admittance diagram as a function of frequency for the FIGURE 1A circuit admittance presented to tunnel diode 1.

FIGURE 3 is a graph of the admittance 31 presented to the tunnel diode 1 in which the real and imaginary components are plotted as a function of frequency from zero towards infinity for a tunnel diode frequency converter having two tuned circuits. For zero frequency, or D.-C., the admittance presented to the negative resistance of the tunnel diode has no reactive component and the real part is much larger than the magnitude of the tunnel diode negative conductance $|g_D|$ at the bias point D. This admittance is contributed by the series conductance $1/R_s$ of the tunnel diode device and the loss in the circuit. For A.-C. signals of low frequency, the capacitance effects predominate over the inductance and a substantial negative imaginary component results. Also, the real component of the admittance is reduced until the imaginary component of the admittance becomes zero again at the intermediate frequency point $\omega_{if}$. For further increases in frequency, the real component of the admittance increases as the imaginary component assumes substantial values and then returns through zero. The admittance plot returns towards the intermediate frequency point $\omega_{if}$ for increasing frequency as the real component becomes smaller and the imaginary component passes through negative values until the local oscillator frequency point $\omega_{lo}$ is reached slightly below the magnitude of the tunnel diode negative conductance. For increasing frequency, the admittance assumes increasing positive values for the imaginary component of admittance. If the input signal frequency $\omega_{rf}$ is the difference of the local oscillator frequency $\omega_{lo}$ and the intermediate frequency $\omega_{if}$ the input radio frequency point $\omega_{rf}$ occurs below $W_{lo}$. An image frequency $\omega_{img}$ occurs at the sum of the local oscillator and intermediate frequencies.

Because of the admittance characteristics of the FIGURE 1A circuit, as illustrated in FIGURE 3, the converter will only oscillate at the desired local oscillator frequency. Furthermore, amplification will be provided at the input radio-frequency and output intermediate-frequency while oscillation and amplification are generally suppressed at other frequencies. Also, because the intermediate-frequency circuit is connected across the waveguide at a node of the local oscillator and input radio-frequency waves, the adjustment of the bias and intermediate frequency circuits is independent of the input and local oscillator frequency circuit and the necessary admittance characteristics are therefore easily obtained.

FIGURE 4A is a schematic diagram of a second embodiment of a microwave tunnel diode frequency converter which mixes at the second harmonic of the local oscillator wave. A mixer strip line 53, conveniently of the same form as strip line 3 in FIGURE 1A, is dimensioned to provide a length equal to one half the wavelength of the local oscillator wave between capacitive elements 57 and 67 which are similar to the capacitor 7 in FIGURE 1A. An input radio-frequency signal is applied to the mixer strip line 53 by means of a coupling line 54. A tunnel diode is positioned between the conductors of the mixer strip line 53 at one end thereof and spaced from capacitor 57 by a distance such as to provide a reactance which together with the reactance of the tunnel diode produces resonance at the local oscillator frequency. To improve the stability of the local oscillator, an auxiliary synchronizing oscillator 68 is connected to the mixer strip line 53. The synchronizing oscillator is a low-power oscillator having a stable frequency of oscillation and may be of the type disclosed in the copending application of Frank V. Adamthwaite and Chang S. Kim, Serial No. 76,908, filed December 19, 1960, now U.S. Patent No. 3,041,552 and assigned to the same assignee. Alternatively, the synchronizing oscillator 68 can be coupled to the mixer strip 53 with the radio-frequency wave through line 54. The use of an auxiliary oscillator is an optional modification of any converter incorporating the present invention and its use is only dictated by the requirements of stability and synchronization. An output intermediate frequency signal is made available at an output terminal 58 connected to the mixer strip 53 at capacitor 67 which is a node for the local oscillator wave. An inductor 69 is connected in parallel with capacitors 57 and 67 to provide a parallel resonant tank circuit for the intermediate frequency signal. In series with the inductor 69 is a bias resistor 61 and a source of D.-C. potential 60 provides a D.-C. bias for the tunnel diode 51.

FIGURE 4B illustrates standing wave patterns for the input radio-frequency wave 72 and local oscillator wave 71 in the FIGURE 4A circuit. The local oscillator wave has nodes at the two capacitive elements 57 and 58 which are spaced a half wavelenth, $\lambda_{lo}/2$, apart. The input radio frequency wavelenth is slightly less than half the local oscillator wavelength $\omega_{lo}$. The distance $s_r$ between the end of mixer strip 53 at which tunnel diode device 51 and capacitive element 57 provides a resonance producing reactance at the local oscillator frequency for the tunnel diode device as in the converter of FIGURES 1A, 1B and 1C.

Figure 5:
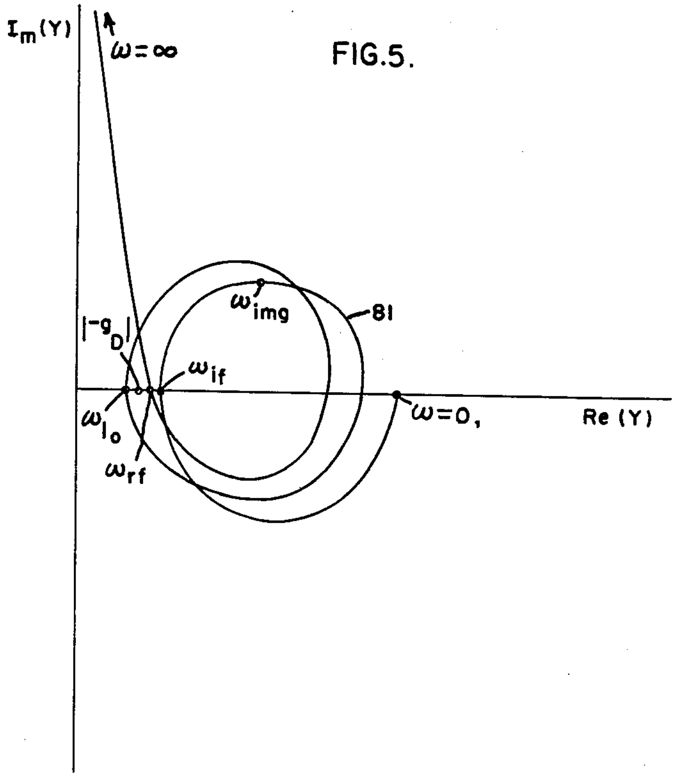
FIGURE 5 is an admittance diagram as a function of frequency for the FIGURE 4A circuit admittance presented to the tunnel diode 51.

FIGURE 5 is an admittance diagram in which the real and imaginary components are plotted as a function of frequency (similar to FIGURE 4A) but for a frequency converter operating in a harmonic mode. This converter has three tuned circuits, one of which is tuned to the input RF frequency. This arrangement suppresses noise at the image frequency and can be provided in either harmonic or non-harmonic converters. For D.-C. the admittance 81 is primarily that of the tunnel diode device resistance $R_s$. The intermediate frequency point at $\omega_{if}$ appears at the next point with a zero reactive component and with a real component of admittance which is much less than the conductance $1/R_s$ but larger than the magnitude of the tunnel diode negative conductance $|g_C|$. The admittance plot for higher frequencies traverses a complete loop passing through the abscissa at a large value for the real component and intersects the abscissa again at the local oscillator point $\omega_{lo}$ having a small value for the real component of admittance which is less than the magnitude of the tunnel diode negative conductance. After another loop (again passing through the abscissa at a large value for the real component), the admittance intersects the abscissa again at the input radio frequency point $\omega_{rf}$. For frequencies above $\omega_{rf}$, the admittance assumes increasingly larger positive values for the imaginary component. The image frequency is indicated at $\omega_{img}$ which occurs at $2\omega_{lo}\pm\omega_{if}$.

When the source of D.-C. potential 60 in the converter circuit of FIGURE 4A provides a D.-C. bias for tunnel diode 51 at approximately point C, as illustrated in FIGURES 2A and 2B, efficient mixing is produced at the second harmonic of the local oscillator frequency. A local oscillator wave 28 varies the voltage across the tunnel diode 51 in such a manner that the conductance 27, which produces the mixing, has an approximately sinusoidal variation at twice the local oscillator frequency. Because of the admittance characteristics of the FIGURE 4A circuit as illustrated in FIGURE 5, the converter will only oscillate at the desired local oscillator frequency. Also, there will be amplification of the input radio frequency wave and the output intermediate frequency wave. The converter circuit is resonant at these three frequencies and the imaginary component of the circuit admittance increases sharply for frequencies near these resonant points. Because of the substantial imaginary component of admittance for frequencies other than those specified, suppression of undesired oscillation and amplification is obtained. In particular, response to noise at the image frequency $\omega_{img}$, is suppressed. Because of the large frequency differential between the resonant frequencies, it can be seen that the admittances at the input radio-frequency and local oscillator frequency are relatively independent and adjustments of the circuit to produce the desired resonant conditions can be made with relatively little interaction. Also, because the intermediate-frequency circuit is connected across the transmission line at a node of the local oscillator and input radio-frequency waves, the adjustment of the circuits is independent and the necessary admittance characteristics are further simplified.

While the fundamental novel features of the invention have been shown and described as applied to illustrative embodiments, it is to be understood that all modifications, substitutions and omissions obvious to one skilled in the art are intended to be within the spirit and scope of the invention as defined by the following claims.

What is claimed is:

1. A self-oscillating microwave converter for converting signals of a given input radio-frequency to an output intermediate-frequency comprising: a two-terminal device exhibiting a negative conductance region in its current-voltage characteristic; a section of transmission line, for sustaining resonance at the local oscillator frequency and exhibiting an admittance such as to apply waves of signal frequency to said diode at sufficient amplitude for frequency conversion, coupled to said diode; a capacitive element, providing a short circuit at the local oscillator and input signal frequencies, connected across said section of transmission line at a node of the local oscillator wave; input means coupled to said transmission line section for introducing an input signal to be converted to an intermediate frequency signal; and a resonant circuit tuned to the intermediate frequency and coupled to said transmission line section at said node to produce an output signal.

2. The microwave frequency converter of claim 1 wherein said input radio-frequency and said local oscillator frequency are close.

3. The microwave frequency converter of claim 1 wherein said input radio-frequency and an integral multiple of said local oscillator are close.

4. A tunnel diode microwave converter for converting signals of a given input radio-frequency to an output intermediate-frequency comprising: a section of transmission line; a capacitive element connected as a short circuit for signals at the local oscillator and input frequencies across said transmission line section and positioned an integral multiple of a quarter wavelength of the local oscillator wave from a first end of said section at a node to provide a resonator for the local oscillator; a tunnel diode connected between the conductors of said section at the second end thereof, the distance between said capacitive element and said second end of the waveguide section being such as to present a reactance which together with the parasitic reactance of the tunnel diode device produces resonance at the local oscillator frequency; bias means coupled to said transmission line section at said node to apply a D.C. voltage to said tunnel diode which biases the tunnel diode into the negative conductance region; a resonant circuit tuned to the intermediate frequency and coupled to said transmission line section at said node to produce an output signal at the desired intermediate frequency; and input means coupled to said transmission line section for introducing an input radio frequency signal to be converted to the intermediate frequency signal.

5. The tunnel diode converter of claim 4 further comprising: an auxiliary oscillator coupled to said section of transmission line to provide a frequency stabilizing signal at the local oscillator frequency.

6. A self-oscillating tunnel diode frequency converter for converting signals of a given input radio-frequency to an output intermediate-frequency comprising: a section of transmission line; capacitive means positioned in said transmission line section to provide a short circuit for signals propagating therein at the local oscillator and input frequencies, said capacitive means being positioned an integral multiple of a quarter wavelength of the desired local oscillator wave from a first end of said section at a node; a tunnel diode connected between the conductors of said section at the second end thereof, the position of said diode termination being selected such that the distance between said capacitive means and said second end of the transmission line section presents a reactance which together with the reactance of the tunnel diode device produces resonance at the local oscillator frequency; bias means coupled to said transmission section at said node to apply a D.-C. voltage to said tunnel diode which biases the tunnel diode into the negative conductance region; a resonant circuit tuned to the intermediate frequency coupled to said transmission line section at said node providing an output signal at the desired frequency; and input means coupled to said transmission line section for introducing a radio frequency signal to be converted to the intermediate frequency.

7. A microwave harmonic converter for converting signals of a given input radio-frequency to an output intermediate-frequency comprising: a section of transmission line; capacitive means positioned at a pair of node points in said transmission line section to provide a short circuit for waves propagating therein at the local oscillator and input frequencies, said capacitive means being spaced an integral multiple of a half wavelength of the desired local oscillator wave; a tunnel diode connected between the conductors of said section at one end thereof, the position of said diode termination being selected such that the distance to the nearest capacitive means presents a reactance which together with the reactance of the tunnel diode device produces resonance at the local oscillator frequency; bias means coupled to said transmission line section at one of said nodes to apply a D.C. voltage to said tunnel diode which biases the tunnel diode into the negative conductance region; a resonant circuit tuned to the intermediate frequency coupled to said transmission line section at one of said nodes providing an output signal at the desired frequency; and input means coupled to said transmission line section for introducing the radio frequency signal to be converted to the intermediate-frequency signal.

8. A microwave harmonic converter for converting signals of a given input radio-frequency to an output intermediate-frequency comprising: a section of transmission line; capacitive means positioned at a pair of node points in said transmission line section to provide a short circuit for waves propagating therein at the local oscillator and input frequencies, said capacitive means being spaced an integral multiple of a half wavelength of the second harmonic of the desired local oscillator wave; a tunnel diode connected between the conductors of said section at one end thereof, the position of said diode termination being selected such that the distance to the nearest capacitive means presents a reactance which together with the reactance of the tunnel diode device produces resonance at the local oscillator frequency; an auxiliary oscillator coupled to said section of transmission line to provide a frequency stabilizing signal at the local oscillator frequency; bias means coupled to said transmission line section across one of said capacitance means at one of said nodes to apply a D.-C. voltage to said tunnel diode which biases the tunnel diode at the maximum negative conductance point; a resonant circuit tuned to the intermediate frequency coupled to said transmission line section at one of said nodes providing an output signal at the desired frequency; and input means coupled to said transmission line section for introducing a radio frequency signal to be converted to an intermediate-frequency signal.

References Cited in the file of this patent

UNITED STATES PATENTS 2,978,576 Watters ---------------- Apr. 4, 1961

OTHER REFERENCES

1961 International Solid-State Circuits Conference, Feb. 16, 1961, pp. 88, 89 (first edition); Session VIII: Microwave Applications; "Microwave Tunnel Diode Autodyne Receiver," Sterzer et al.